*US007530038B2*

(12) United States Patent  (10) Patent No.: US 7,530,038 B2
Gristede et al.  (45) Date of Patent: May 5, 2009

(54) METHOD AND PLACEMENT TOOL FOR DESIGNING THE LAYOUT OF AN ELECTRONIC CIRCUIT

(75) Inventors: George D. Gristede, Katonah, NY (US); Wilhelm Haller, Remshalden (DE); Friedhelm Kessler, Boeblingen (DE); Matthias Klein, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 11/530,038

(22) Filed: Sep. 8, 2006

(65) Prior Publication Data

US 2007/0083837 A1    Apr. 12, 2007

(30) Foreign Application Priority Data

Oct. 7, 2005  (EP) .................................. 05109318

(51) Int. Cl.
*G06F 17/50* (2006.01)
(52) U.S. Cl. ........................................................ 716/11
(58) Field of Classification Search .................... 716/11
See application file for complete search history.

(56) References Cited

U.S. PATENT DOCUMENTS 4,908,772 A * 3/1990 Chi .............................. 716/10
5,281,558 A * 1/1994 Bamji et al. .................... 716/2
7,305,641 B2 * 12/2007 Tang ............................ 716/10
2008/0005713 A1 * 1/2008 Singh et al. .................... 716/11
2008/0168410 A1 * 7/2008 Pikus et al. ..................... 716/5

* cited by examiner

*Primary Examiner*—Jack Chiang
*Assistant Examiner*—Brandon W Bowers
(74) *Attorney, Agent, or Firm*—Lynn L. Augspurger

(57) ABSTRACT

According to the present invention a method for the placement of electronic circuit components is provided that supports design modifications by realizing and maintaining relations between the layouts of the components (i1 to i6). These relations are based on relations between the geometrical shapes represented by the layouts for the components. The invention can be implemented by an interactive layout editor.

When a layout or the placement of a layout is changed manually, then the placement of the components that are placed already is changed automatically such that the all the relations between the components are realized or maintained. A parent-child relationship can be defined between components such that when the parent component is changed or moved then only the placement of its children is updated automatically. The prioritisation of relations allows resolving conflicts between conflicting relations.

5 Claims, 5 Drawing Sheets

METHOD AND PLACEMENT TOOL FOR DESIGNING THE LAYOUT OF AN ELECTRONIC CIRCUIT

BACKGROUND OF THE INVENTION

1. Field of the Invention

In general, the present invention relates to the design of critical electronic circuits to be implemented on a chip or a printed circuit board. Especially, the present invention relates to a method for designing the layout of an electronic circuit, and a corresponding placement tool and computer program product.

2. Description of the Related Art

Using new technologies, the placement, which entails the wiring, has an increasing effect on signal delay of electronic circuitry. In order to receive accurate timing information early in the design phase, it is necessary to start physical placement of components as early as possible, even before designs are stable from the logic design point of view. Thus, new placing methods are required which can easily adapt design changes.

A layout representation of an electronic circuit comprises descriptions of the placement and wiring of all the components of the electronic circuit. An electronic circuit component can also be represented by a layout comprising planar geometric shapes, which span all needed, but hidden shapes in the layout editor to produce an electronic circuit in a chip manufacturing. A layout for an electronic circuit component needs to be placed in the layout for the electronic circuit.

As the layouts generated by conventional automatic placement tools cannot sufficiently fulfill all the design requirements, there is an increasing need to design critical electronic circuits of a chip in custom design style to receive the required performance. Besides performance, also additional design requirements such as the creation of dedicated regular structures or bit stacks can only be fulfilled by custom designs.

According to the state of the art designing electronic circuits in custom design style comprises the following steps:
1. Generating the layout representation for every component of the electronic circuit to be implemented. This can be done with a Layout Editor of the used CAD (Computer-Aided Design) system
   a. completely manually by creating the correct planar geometrical shapes and all needed hidden shapes with the Layout Editor or
   b. by using existing layout models from a library available in the CAD system or
   c. by generating them with a program code used by the CAD system.
2. Placing every so generated layout for a component in the 2-dim. coordinate system of the Layout Editor by
   a. "Drag and Drop"-moving the layouts for the components to that location the user wants it to be or
   b. executing a program code that places the layouts for the components according to an algorithm.
   In both cases every layout for a component receives absolute coordinates representing the location of the layout for the placed component.
3. Often, it is necessary to modify the layout of an electronic circuit to improve the performance of the corresponding electronic circuit. Those modifications are e.g. an exchange or displacement of the layout for a single component or modifications in shape and/or size of the layout for a single component. As consequence, an overlap and or empty space may occur between some of the layouts. Then, the locations of the layouts being affected by said modifications have to be aligned manually, because in most cases existing program algorithms do not meet the individual design requirements of critical electronic circuits.
4. Creating the wiring to connect the layouts electrically by
   a. routing the connections with a Wire Editor manually or
   b. running a Wiring-Router to do the job.
5. Finishing the custom circuit design according to the Design Rules for that particular chip technology.
6. Running all necessary Design Rule Checks.

The steps 2 and 3 create an inherent problem in the custom circuit design flow. For example, if the layout for a component is changed manually such that it overlaps the layout for another component, this will result in an electrical short and a malfunction of the logic function to be implemented by the electronic circuit. Another examples are manual layout changes for components that lead to unused chip area, and hence to larger and more expensive chips. The designer then needs to adapt the placement for all the components affected by this change manually. This is a time consuming and error prone task.

OBJECT OF THE INVENTION

It is therefore an object of the present invention to provide a method to design the layout of an electronic circuit that is improved over the prior art. Said method simplifies and supports design modifications, especially exchanges or displacements of single components or modifications in shape and/or size of the geometrical shapes represented by the layout for single components, which influence the placement of other components of the electronic circuit.

BRIEF SUMMARY OF THE INVENTION

The advantages of the present invention are achieved by a method, system, and computer program product as laid out in the independent claims. Further advantageous embodiments of the present invention are described in the dependant claims and are taught in the following description.

The present invention provides a method for designing electronic circuits with several components, like LSIs (Large Scale Integrated Circuit) and VLSIs (Very Large Scale Integrated Circuit). According to said method a layout representation is generated for each component of the electronic circuit. Then, every so generated planar geometrical shape for a component is placed in a 2-dimensional coordinate system of a layout editor by:
   a) defining and storing coordinates for the geometrical shape represented by the layout for at least one first component;
   b) defining and storing at least one relation between said first component and at least one second component by defining a relation between the geometrical shapes;
   c) realizing said relation automatically by generating and storing the corresponding coordinates for the planar geometrical shape represented by the layout for said second component;
   d) defining and storing at least one further relation between at least one component already placed and at least one next component by defining a relation between the geometrical shapes represented by the layouts of these components;
   e) realizing said further relation automatically by generating and storing the corresponding coordinates of the geometrical shape represented by the layout of said next component;

f) repeating steps d) and e) until coordinates are assigned to all geometrical shapes represented by the layout for the components.

If necessary, the layout for at least one component is modified and/or the coordinates of the geometrical shape represented by the at least one layout are modified. Then, all the relations concerning said modified layout are realized or maintained automatically by generating and storing corresponding new coordinates for the geometrical shapes of the layouts for all the related components. Thus, the method according to the present invention represents a very good support for design modifications.

The definition of the coordinates of a geometrical shape is called the placement of the layout for the component that represents this shape, and is also called the placement of the component. The change of the coordinates of a geometrical shape is called a movement of the layout for the component that represents this shape; it is then also called a change in the placement of the component or the layout.

The relations can be used to maintain design rules. This is called legalization for a layout of an electronic circuit. One obvious design rule is to forbid short-circuits. This rule requires that the geometrical shapes of two different components are not allowed to overlap. They can, however, be connected in order to save wires connecting components. Especially, a relation can be defined automatically based on design rules.

In one embodiment of the invention the placement for the components placed already is changed such that all the relations between these components are realized or maintained when a layout for a component is changed or moved.

According to the preferred embodiment of the present invention a placement tool is provided for designing electronic circuits with several components, like LSIs (Large Scale Integrated Circuits) and VLSIs (Very Large Scale Integrated Circuits). The placement tool can be an extension of an existing interactive layout editor.

The placement tool according to the present invention is based on the idea of maintaining geometrical relations between single components of an electronic circuit during the whole procedure of designing an electronic circuit. Thus, one aspect of the placement tool according to the present invention is to allow the definition of individual geometrical relations between single components for each electronic circuit to be implemented. Another aspect of said placement tool is that the priority of geometrical relations once defined is higher than the priority of coordinates assigned to the corresponding related components. In case of design modifications concerning one of said related components this results in an automatic movement of the other related components to maintain their geometrical relation. Thus, the placement tool of the present invention simplifies design modifications, especially in case of modifications in size and position of single components which influence the placement of other components of the electronic circuit.

In a very advantageous embodiment of the present invention the method allows to prioritize one component of several related components. Therefore said placement tool further comprises means to define and store at least one component as parent component and at least one component, which is geometrically related to said parent component, as child component. Said placement tool further comprises means to express a parent-child-relation by realizing and maintaining said geometrical relation between parent component and child component only automatically when new coordinates are assigned to said parent component and/or the layout of said parent component is modified. In contrary, assigning new coordinates to said child component and/or modifying the layout of said child component does not affect the coordinates of said parent component. By defining single components as parent components it is possible to consider their importance in the design of the whole electronic circuit. So, it is possible to maintain their location, although related child components are moved, or to move a whole group of related components by only moving the parent component of the group. Thus, parent components represent "anchor points" for a whole group of related child components.

As the individual components of an electronic circuit have different physical functions affecting the placement of the corresponding component it is useful to prioritize the placement of single components with respect to related components. Therefore, the present invention proposes to define and store at least one component as parent component while at least one component being directly related to said parent component is defined and stored as child component. As consequence of this definition, only a modification of the layout or coordinates of said parent component results in an automatic modification of the coordinates of said child component, whereas a modification of the layout and/or coordinates of said child component does not affect the coordinates of said parent component.

BRIEF DESCRIPTION OF THE DRAWINGS

The above, as well as additional objectives, features and advantages of the present invention, will be apparent in the following detailed written description of an illustrative example when read in conjunction with the accompanying drawings, wherein.

DETAILED DESCRIPTION OF THE INVENTION

The herein described example of a 4 bit comparator will illustrate the design of an electronic circuit and especially the placement of the corresponding components, once according to the state of the art to demonstrate the problems occurring in case of design modifications, and once according to the invention to demonstrate especially the handling of design modifications. Although, the 4 bit comparator being only an example the problems of the state of the art and the advantages of the invention are valid for all kind of circuitry.

Figure 1:
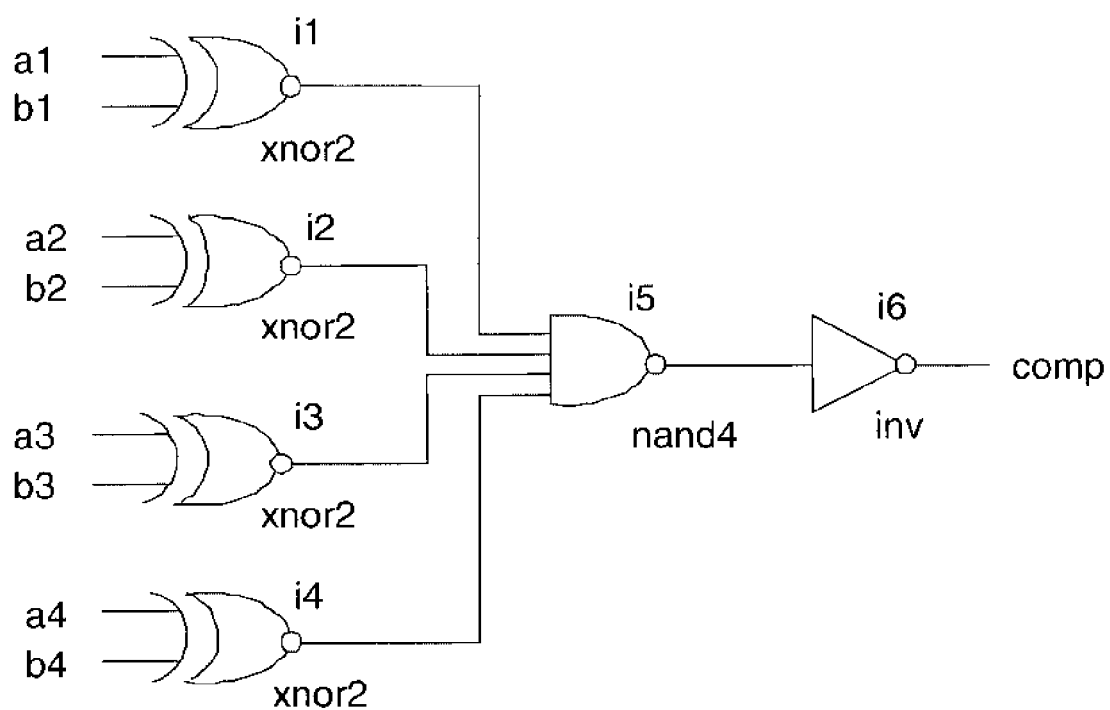
FIG. 1 shows a circuit diagram for a 4 bit comparator.

The 4 bit comparator shown in FIG. 1 comprises the components i1 to i6.

Both according to the state of the art and according to the present invention, the first step to design a chip layout for this 4 bit comparator is to generate a layout representation for each component i1 to i6 of the electronic circuit.

According to the state of the art, every component is then placed in the 2-dim, coordinate system of a Layout Editor. There are several methods to do so, for example a. "Drag and Drop" the components to that location the user want it to be or b. Executing a program code that places the components according to an algorithm.

In any case, absolute coordinates are assigned to the geometrical shapes represented by the layout for each component wherein said absolute coordinates represent the location of the corresponding shape.

In the preferred embodiment of the invention, the planar geometric shapes represented by a layout for a component of an electronic are completely contained within a polygonal shape, for example a rectangular shape. With regard to an easy handling of the placement tool proposed by the present invention it is advantageous to use relations between edges and/or angle points of the polygonal shapes as geometrical relations. This kind of geometrical relation is very expressive on the one hand and easily to define on the other hand.

Figure 2:
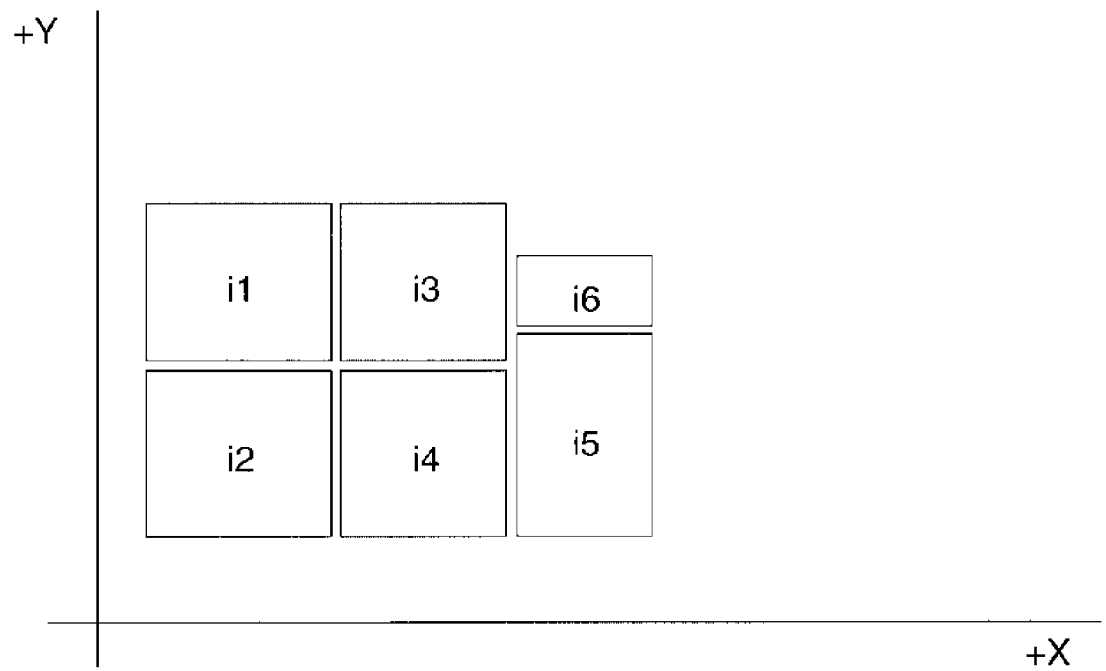
FIG. 2 shows a layout for the 4 bit comparator illustrated in FIG. 1.

FIG. 2 shows the 2-dim. coordinate system with the components i1 to i6 placed according to the state of the art. The geometrical shapes represented by the layouts for the components i1 to i6 are completely contained in a rectangular shape each. For reasons of simplicity and clarity of the explanations these rectangular shapes are used conterminously to the shapes represented by the layouts for the components i1 to i6 in the remainder of the detailed description.

Figure 3:
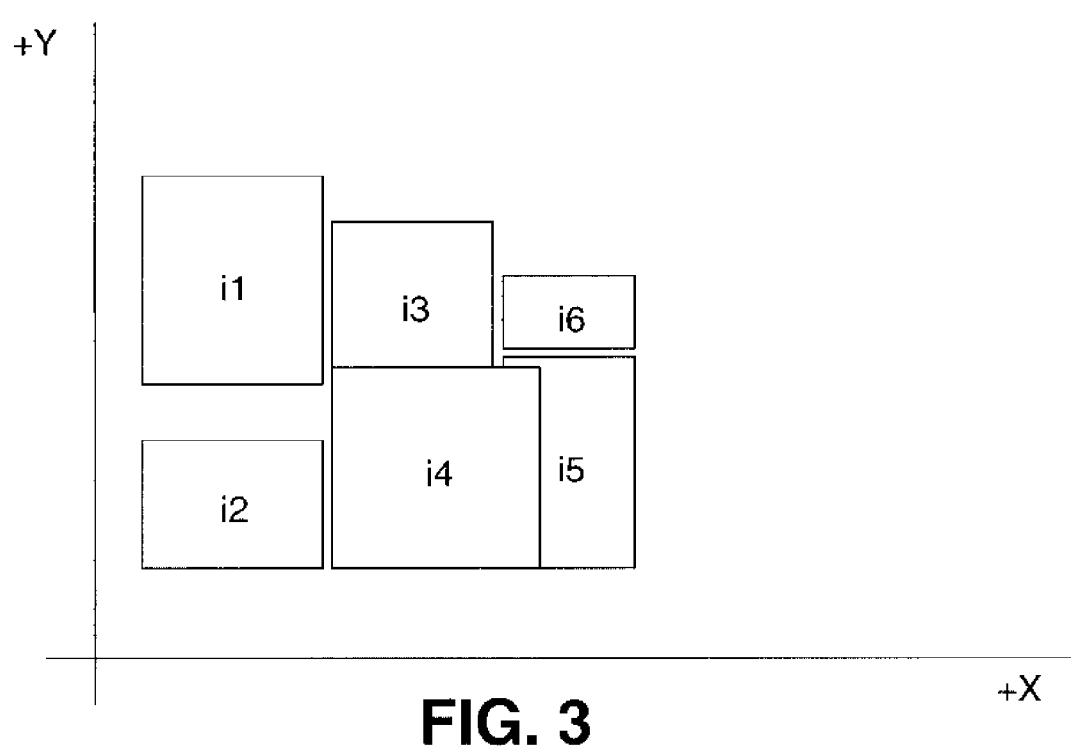
FIG. 3 shows layout problems after modifications of the placed layout illustrated in FIG. 2.

Often, it is necessary to modify the layout of an electronic circuit to receive the required performance. FIG. 3 illustrates some of the problems arising only from modifications in size of the planar geometric shapes represented by the layout for the components i1, i2 and i4. The size of the shape for i2 was reduced in -Y direction, while the size of the shape for i1 was increased in +Y direction. Further, the size of the shape for i4 was increased in +X and +Y direction. These modifications result in empty space between the shapes for i1 and i2 on the one hand and an overlap of the shapes for i3 and i4 as well for i4 and i5 on the other hand. According to the state of the art, alignment of these shapes has to be carried out manually, because in most cases a program algorithm would change the whole layout in an undesirable extent.

As already explained above, the placement of components according to the invention is based on relations between single components instead of absolute coordinates assigned to every geometric shape represented by the layouts of the components according the state of the art.

Thus, according to the invention each component i1 to i6 is placed in the 2-dim. coordinate system of the Layout Editor in a new way in the here described example, a GUI (Graphical User Interface) based program is used which allows the user to define and store at least one relation between at least two components of the electronic circuit. Besides, said GUI based program allows realizing and maintaining automatically relations once defined for related components, what will be explained in connection with FIGS. 4 to 7.

Figure 4:
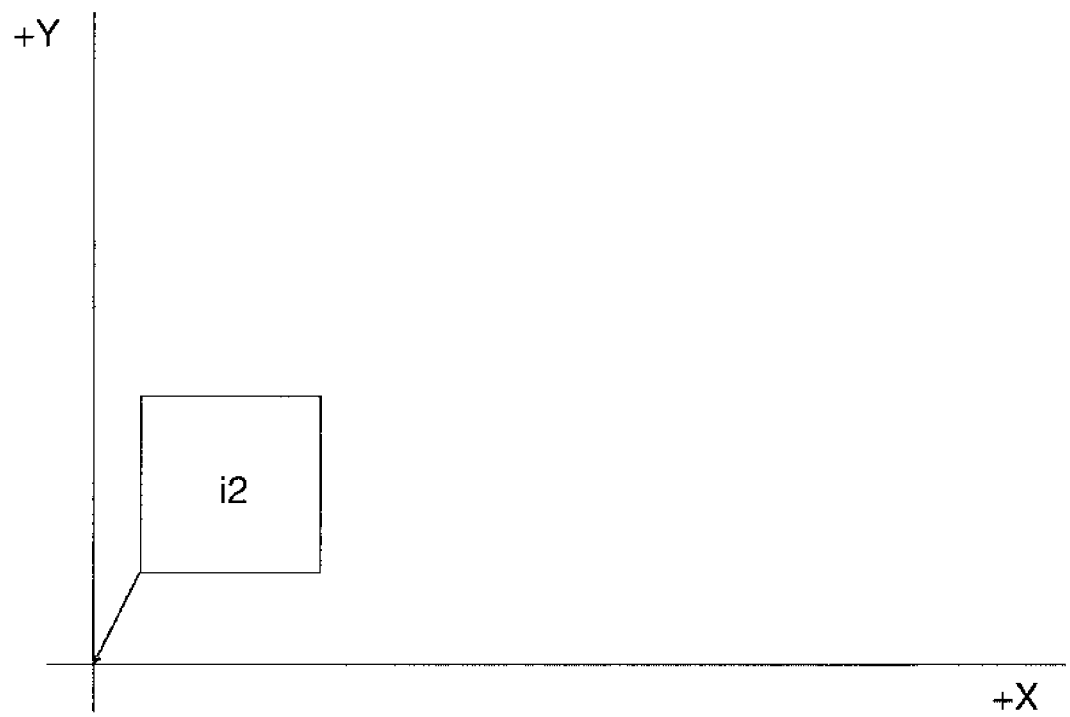
FIG. 4 to 7 show the steps of placing the components illustrated in FIG. 2 according to the present invention.

In a first step, illustrated by FIG. 4 absolute coordinates are assigned to shape for component i2 and stored as "offset-relation" to the origin of the coordinate system of the Layout Editor. Said "offset-relation" may be defined as "lower left corner of the shape for i2 has offset of (xy) to origin of coordinate system". Besides, component i2 is defined and stored as parent component, thus forming an "Anchor point" for all related components.

Figure 5:
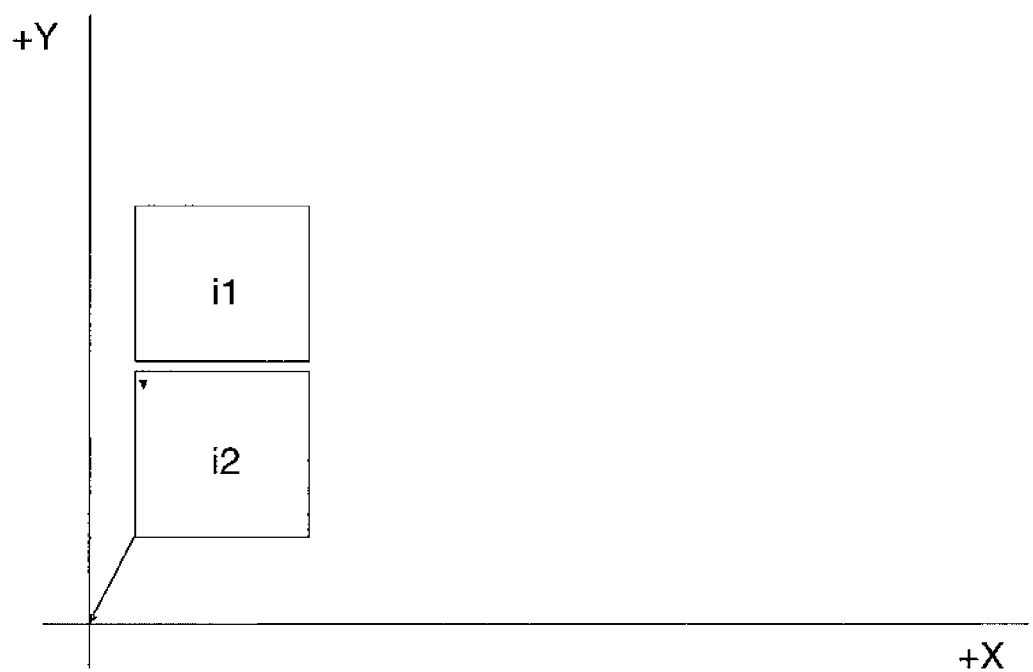

In a second step, illustrated by FIG. 5, a geometrical relation between already placed component i2 and the next component to be placed i1 is defined and stored as "lower left corner of the shape for i1 has offset of (xy) to upper left corner of the shape for i2". Then, component i1 is placed accordingly. Besides, the layout for component i1 is defined and stored as child component of component i2.

Figure 6:
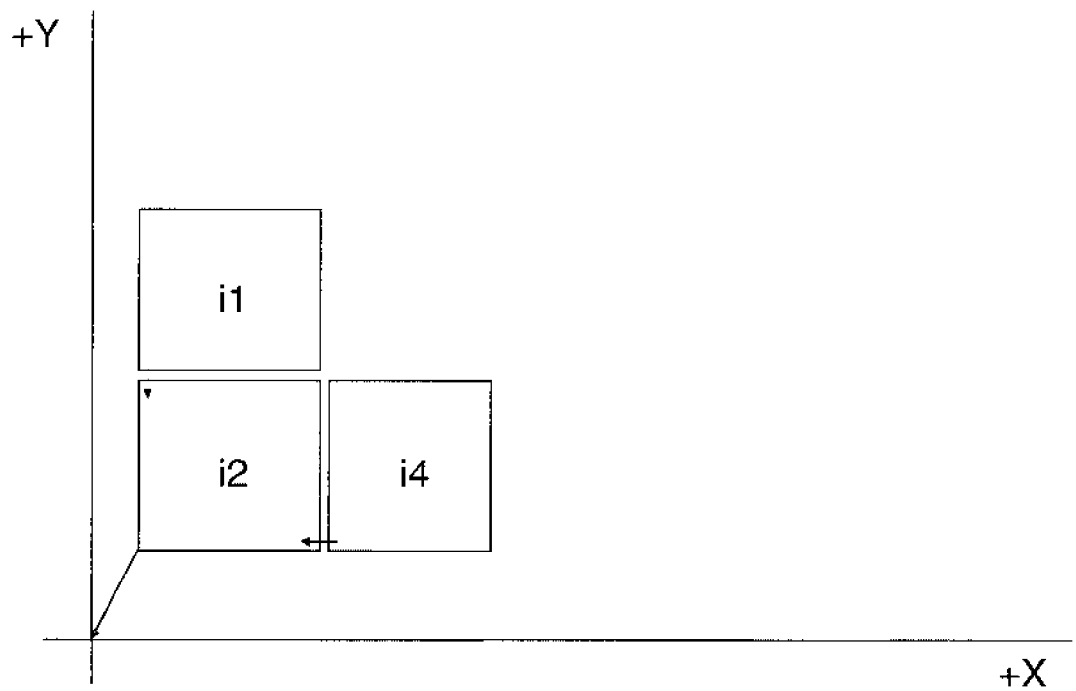

FIG. 6 illustrates the next step of placement, wherein a geometrical relation is defined and stored between at least one component already placed, here component i2, and the next component to be placed i4 as "lower left corner of the shape for i4 has offset of (xy) to lower right corner of the shape for i2". Then, component i4 is placed accordingly. Also component i4 is defined and stored as child component of component i2.

Figure 7:
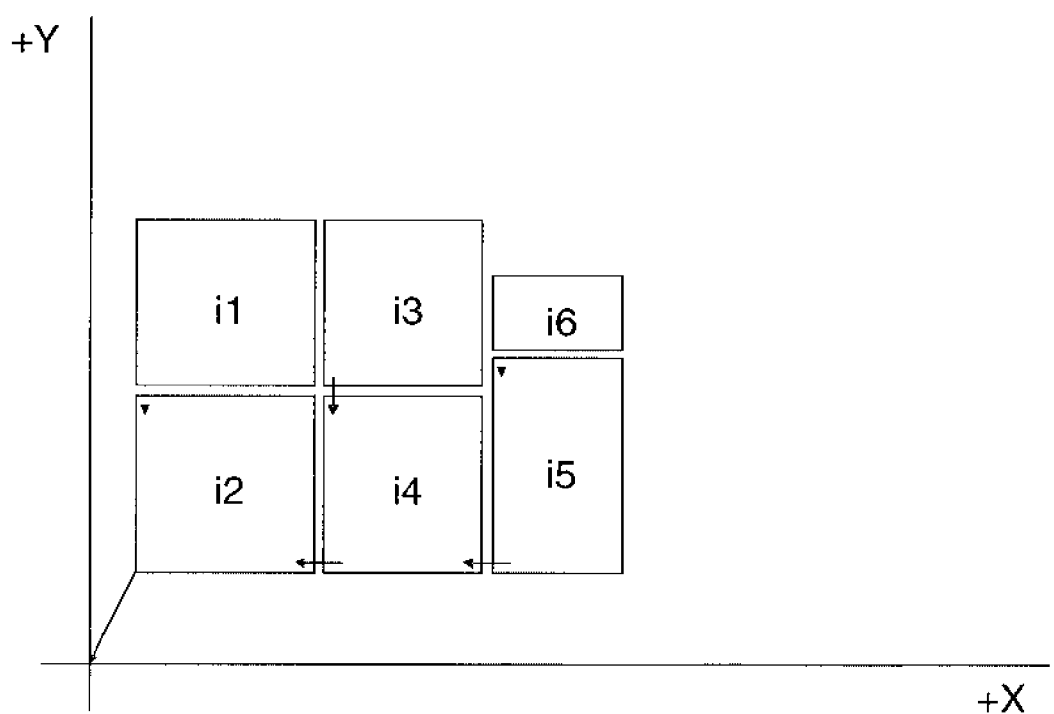

This procedure is repeated for the remaining components i3, i5 and i6 defining and storing the geometrical relations "lower left corner of the shape for i3 has offset of (xy) to upper left corner of the shape for i4", "lower left corner of i5 has offset of (xy) to lower right corner of i4", and "lower left corner of the shape for i6 has offset of (xy) to upper left corner of the shape for i5". FIG. 7 shows the resultant placement of all components i1 to i6 relative to one another.

Figure 8:
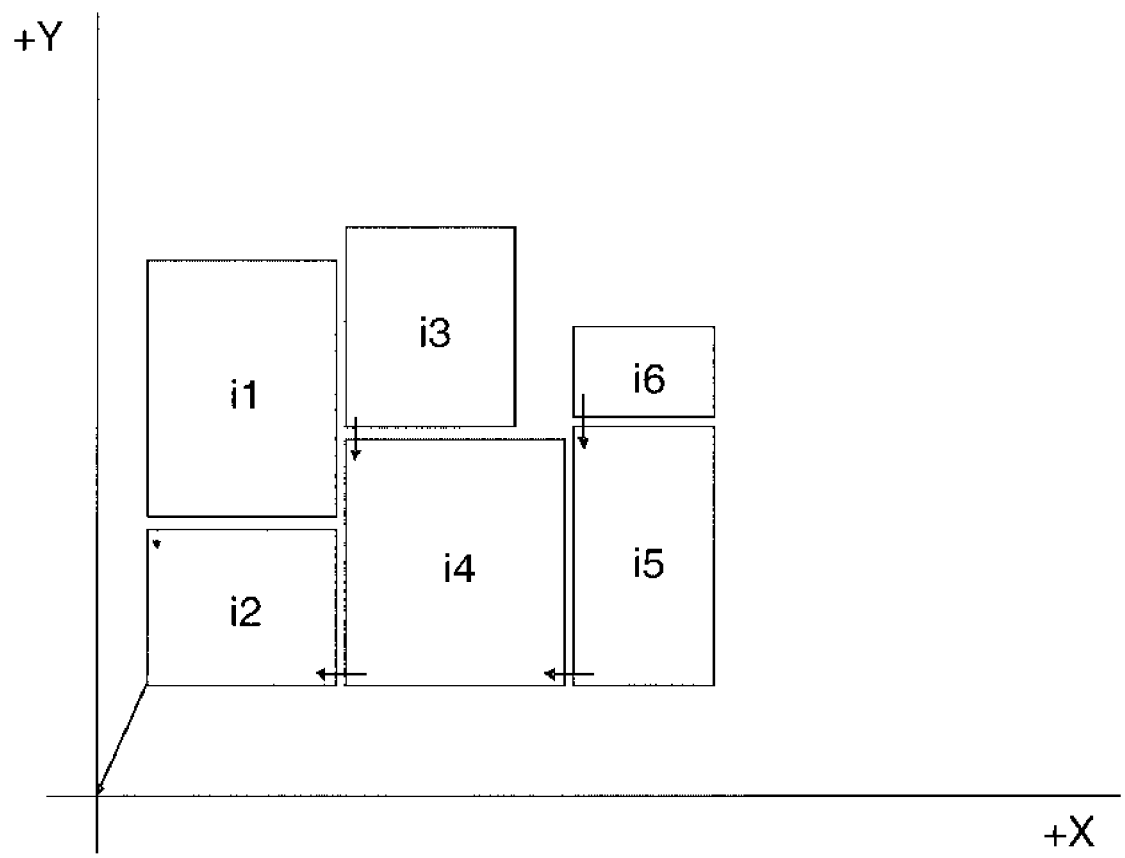
FIG. 8 shows the realisation of layout modifications according to the present invention in case of the layout illustrated in FIG. 7.

FIG. 8 illustrates how the invention supports design modifications, as shown in FIG. 3, by using the placement data, especially the geometrical relations, stored in the CAD system.

The design of FIG. 7 was modified by decreasing the size of the geometrical shaped represented by the layout for component i2 in -Y direction, by increasing the size of the geometric shape represented by the layout for component i1 in +Y direction and by increasing the size of the geometrical shape represented by the layout for component i4 in +x and +Y direction. As the shape represented by the layout for component i2 became smaller and is parent component in relation to component i1, the layout for component i1 moved down automatically, because no absolute coordinates were assigned to i1, but a constant relation of lower left corner of i1 to upper left corner of i2. The modification of the layout for component i1 did not affect any other layout for a component of the electronic circuit. As the geometrical shape represented by the layout for component i4 was increased in +x and +Y direction, component i3 moved up automatically, because lower left corner of the geometrical shape represented by the layout for i3 has a constant relation to the upper left corner of the geometrical shape represented by the layout for i4. Besides, component i5 moved to the right side automatically, because the lower left corner of the geometrical shape represented by the layout of i5 has a constant relation to lower right corner of the geometrical shape represented by the layout for i4. As consequence of the displacement of the geometrical shape represented by the layout for i5, also the geometrical shape represented by the layout for component i6 moved to the right automatically, because lower left corner of i6 has a constant relation to upper left corner of i5.

The foregoing description illustrates, that empty space between two geometrical shapes represented by layouts for components and an overlap of several geometrical shapes represented by the layouts for components can be avoided effectively when using geometrical relations between single components to define the locations of the geometrical shapes represented by the layouts for said components.

As illustrated by the example described above, the following features and advantages are offered by implementing the invention:

1. Automated movement of components after design changes, placement changes, increase or decrease of components.
2. Moving of an "anchor" component results in automated moving of all related components.
3. Automated legalisation of placement according to Design Rules provided by the chip manufacturer.
4. Significant decreases of design turn around time.

The particular steps of the method for placing components of an electronic circuit proposed by the present invention can be carried out by different tools of a computer system. But it should be mentioned, that it is especially advantageous to use a placement tool according to the present invention.

In case of conflicting relations between components, it is possible to define a priority level for a dedicated relation. The priority level can be used to resolve a conflict by weighting relations based on their priority level.

The invention claimed is:

1. A computer-based method for designing the layout of an electronic circuit with several components, which are represented as planar geometrical shapes, the method comprising the steps:

defining and storing at least one geometrical relation between at least two components; and defining and storing at least one component as parent component and at least one component, which is geometrically related to said parent component, as child component; and modifying the position or the planar geometrical shape of any component; and calculating new positions for components to maintain the geometrical relations between the modified component and selected other components for which a geometrical relation has been defined; and maintaining automatically said geometrical relation between parent component and child component only when said parent component is modified but not when the child component is modified.

2. The method of claim 1, wherein the planar geometrical shapes are enclosed in a polygon and the relations between the polygons are defined by the position of their edges and/or angle points.

3. The method of claim 2, wherein the relations are defined according to coordinates in a two-dimensional coordinate system.

4. The method of claim 1, wherein the addition or removal of a parent-child relation does not affect the relations of that parent to other children.

5. The method of claim 1, wherein the selected relation between two components takes priority over other relations for the same components.

* * * * *